(12) United States Patent
Seefeldt

(10) Patent No.: US 9,419,577 B2
(45) Date of Patent: *Aug. 16, 2016

(54) TECHNIQUES FOR DISTORTION REDUCING MULTI-BAND COMPRESSOR WITH TIMBRE PRESERVATION

(71) Applicant: Dolby Laboratories Licensing Corporation, San Francisco, CA (US)

(72) Inventor: Alan J. Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/732,271

(22) Filed: Jun. 5, 2015

(65) Prior Publication Data

US 2015/0270819 A1  Sep. 24, 2015

Related U.S. Application Data

(63) Continuation of application No. 13/635,340, filed as application No. PCT/US2011/028439 on Mar. 15, 2011, now Pat. No. 9,083,298.

(60) Provisional application No. 61/315,172, filed on Mar. 18, 2010.

(51) Int. Cl.
*G06F 17/00* (2006.01)
*H03G 9/02* (2006.01)
(Continued)

(52) U.S. Cl.
CPC ............... *H03G 9/025* (2013.01); *H03G 9/005* (2013.01); *H03G 9/18* (2013.01)

(58) Field of Classification Search
CPC ....... H03G 11/00; H03G 5/005; H03G 7/002; H03G 9/005; H03G 9/025; H03G 9/18; H04R 2430/03; H04R 24/453; H04R 25/505
See application file for complete search history.

(56) References Cited

U.S. PATENT DOCUMENTS

| 5,483,600 | A | 1/1996 | Werrbach |
| 5,832,444 | A | 11/1998 | Schmidt |

(Continued)

FOREIGN PATENT DOCUMENTS

| CN | 1627635 | 6/2005 |
| EP | 0591441 | 4/1994 |

(Continued)

OTHER PUBLICATIONS

Cassidy, R.J. et al., "A Tunable, Nonsubsampled, Non-Uniform Filter Bank for Multi-Band Audition and Level Modification of Audio Signals" Conference Record of the Thirty-Eight Asilomar Conference on Signals, Systems and Computers IEEE, 2004, vol. 2, 2228-2232.

*Primary Examiner* — Andrew C Flanders

(57) ABSTRACT

Distortion reducing multi-band compressor with timbre preservation is provided. Timbre preservation is achieved by determining a time-varying threshold in each of a plurality frequency bands as a function of a respective fixed threshold for the frequency band and, at least in part, an audio signal level and a fixed threshold outside such frequency band. If a particular frequency band receives significant gain reduction due to being above or approaching its fixed threshold, then a time-varying threshold of one or more other frequency bands are also decreased to receive some gain reduction. In a specific embodiment, time-varying thresholds can be computed from an average difference of the audio input signal in each frequency band and its respective fixed threshold.

6 Claims, 4 Drawing Sheets

(51) Int. Cl.
*H03G 9/00* (2006.01)
*H03G 9/18* (2006.01)

(56) References Cited

U.S. PATENT DOCUMENTS

| | | |
|---|---|---|
| 6,108,431 A | 8/2000 | Bachler |
| 6,618,486 B2 | 9/2003 | Orban |
| 7,309,829 B1 | 12/2007 | Ludwig |
| 8,521,314 B2 | 8/2013 | Seefeldt |
| 2003/0223597 A1 | 12/2003 | Puria |
| 2005/0123153 A1 | 6/2005 | Toki |

FOREIGN PATENT DOCUMENTS

| | | |
|---|---|---|
| EP | 0986933 | 3/2002 |
| EP | 1251715 | 10/2002 |
| GB | 1385493 | 2/1975 |
| SU | 1223285 | 4/1986 |
| WO | 2008/057173 | 5/2008 |
| WO | 2008/106036 | 9/2008 |

TECHNIQUES FOR DISTORTION REDUCING MULTI-BAND COMPRESSOR WITH TIMBRE PRESERVATION

CROSS REFERENCE TO RELATED APPLICATIONS

This application is a continuation of U.S. patent application Ser. No. 13/635,340 filed on Sep. 14, 2012, which is a national application of PCT application PCT/US2011/028439 filed Mar. 15, 2011, which claims benefit of the filing date of U.S. Provisional Application Ser. No. 61/315,172 filed on Mar. 18, 2010, all of which are hereby incorporated by reference, in their entirety.

TECHNOLOGY

The present invention relates generally to audio presentation and, in particular to, distortion reduction during presentation.

BACKGROUND

Playback devices, such as laptop computers, cellular radiotelephones, portable music players, and televisions, include amplifiers and audio transducers (e.g., loudspeakers) with limited output capabilities. In such devices, audio playback is perceptibly distorted, and often acutely distorted, as playback level is increased during presentation. Further, this distortion is oftentimes frequency dependent for a playback device. For example, a television's form factor may exhibit a resonance response at a specific frequency when an output signal generally exceeds a particular level, resulting in an annoying rattle.

Multi-band compression can be applied to the audio signal prior to playback to reduce distortion and attempt to maximize playback level. A distortion threshold is specified for each frequency band of the compressor. The compressor independently applies differing gain values to each frequency band to ensure an output signal does not exceed any of the corresponding distortion thresholds.

However, this approach can drastically alter timbre, or an attribute of listener perception where two sounds of equal loudness and pitch can be perceived as dissimilar. That is to say, when certain frequencies reach a distortion threshold and others do not, the compressor introduces its own disadvantages by altering relative balance amongst these frequencies. Each band operates in isolation. The resulting sound emerges as aberrant, or otherwise unnatural.

From the above, it is appreciated by the inventor that techniques for timbre preservation with multi-band compression is desirable for a decidedly natural hearing experience.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

SUMMARY OF THE DESCRIPTION

Methods and apparatuses for timbre preservation in a multi-band compressor are provided. Timbre preservation is achieved by determining a time-varying threshold in each of a plurality frequency bands as a function of (i) a respective fixed threshold for the frequency band and, at least in part, (ii) an audio signal level (whether digital or analog audio signal) in a second frequency band and (iii) a fixed threshold in the second frequency band. Consequently, each time-varying threshold is input signal adaptive. If a particular frequency band receives significant gain reduction due to being above its fixed threshold (or alternatively, approaching the fixed threshold), then a time-varying threshold of one or more other frequency bands are also decreased to receive some gain reduction.

In an embodiment of the present invention, a fixed threshold for a first frequency band is provided or otherwise determined. A first level of an audio signal within the first frequency band is determined The first level can be less than the fixed threshold. A second level of the audio signal for a second frequency band is also determined. A time-varying threshold is computed for the first frequency band using the second level—the time-varying threshold being less than the fixed threshold. The audio signal is attenuated within the first frequency band to be equal to or less than the time-varying threshold or, alternatively, the audio signal can be increasingly attenuated within the first frequency band as approaching the time-varying threshold. The time-varying threshold can be computed from an average difference of the audio input signal in each frequency band and its respective fixed threshold. Optionally, a second fixed threshold for the second frequency band can be further determined The second level of the audio signal can exceed the second fixed threshold, resulting in attenuation of the audio signal within the second frequency band to the second fixed threshold.

In another embodiment, a compressor includes a multi-band filterbank, compression function elements, and at least one timbre preservation element. Each compression function element can be dedicated to a frequency band. The timbre preservation element is coupled to the multi-band filterbank and the compression function elements. The timbre preservation element receives a fixed threshold for each frequency band and provides a time-varying threshold for each frequency band. The time-varying threshold for a frequency band is partially determined by a level of the audio signal outside the frequency band.

In yet another embodiment of the present invention, a system includes a multi-band filterbank, a timbre preservation element, and compression function elements. The timbre preservation element receives a fixed threshold for each of a plurality of frequency bands, and it in turn provides time-varying thresholds for the frequency bands. The time-varying thresholds are determined, at least in part, by a level of the audio signal outside such frequency band. In a specific embodiment, time-varying thresholds are a function of an average difference of the audio input signal in each frequency band and its respective fixed threshold.

As another embodiment of the present invention, a system includes a multi-band filter means, compression function means, and a timbre preservation means. The timbre preservation means receives a fixed limit for each of a plurality of frequency bands and provides time-varying thresholds for each such frequency bands. Theses time-varying thresholds are determined by, at least in part, a level of an audio signal and associated fixed threshold outside the respective frequency band.

As an embodiment of the present invention, a predetermined threshold for a first frequency band is provided. A first level of an audio signal within the first frequency band is determined. The first level can be less than the predetermined threshold. A second level of the audio signal for a second frequency band is also determined. A signal adaptive threshold is computed for the first frequency band using the second level—the signal adaptive threshold being less than the predetermined threshold. The audio signal is attenuated within the first frequency band based upon the signal adaptive threshold. In a specific embodiment, the predetermined threshold can be independent of the level of the audio signal within the first frequency band or, in fact, independent of a level in any frequency band. In opposite, the signal adaptive threshold is dependent on the audio signal, particularly the level of the audio signal outside the first frequency band.

BRIEF DESCRIPTION OF DRAWINGS

The present invention is illustrated by way of example, and not by way of limitation, in the figures of the accompanying drawings and in which like reference numerals refer to similar elements and in which.

DETAILED DESCRIPTION OF EXAMPLE POSSIBLE EMBODIMENTS

Figure 1A:
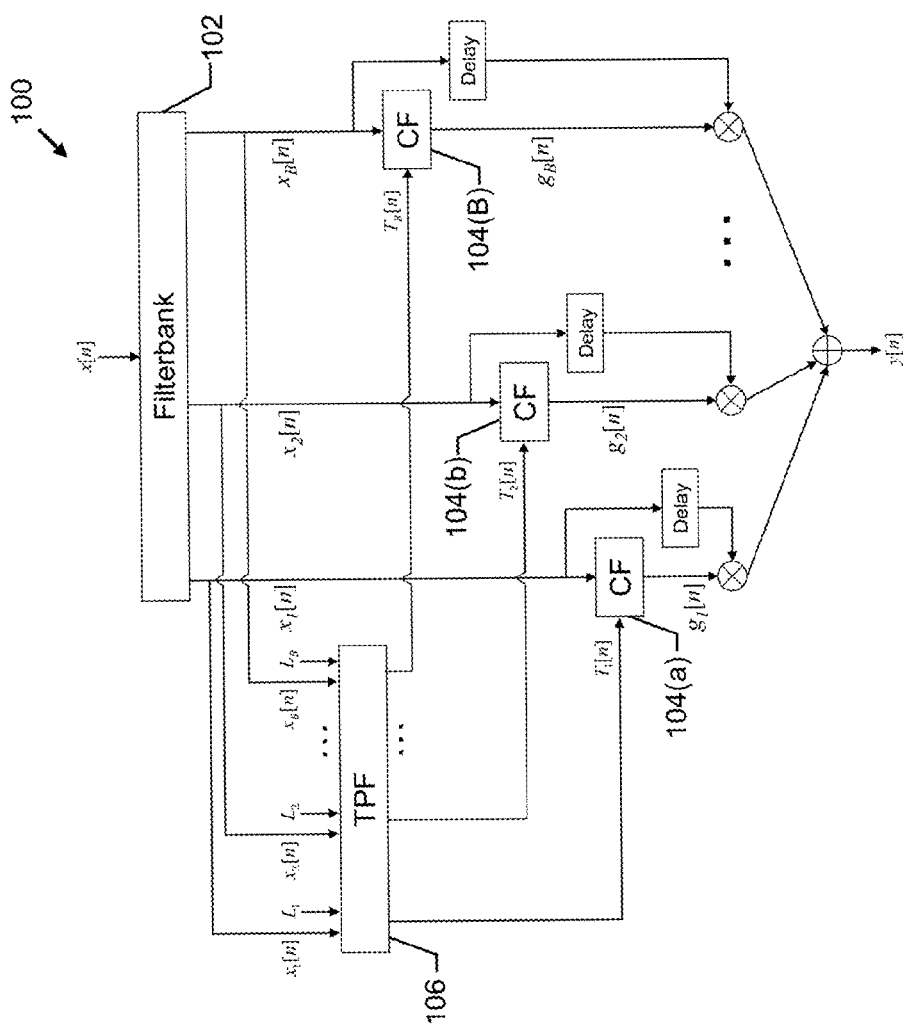
FIG. 1A illustrates an exemplary compressor according to an embodiment of the present invention.

FIG. 1A illustrates an exemplary multi-band compressor 100 with timbre preserving constraint according to an embodiment of the present invention. Compressor 100 receives an input signal x[n], which is split into multiple bands (e.g., B bands, which can be 2, 3, 4, 5, ... 20, or more bands) by a filterbank 102. As an example, an output of each band of filterbank 102 can be computed as the input signal x[n] convolved with a bandpass filter response $h_b[n]$:

$$x_b[n]=h_b[n]*x[n], \; b=1 \ldots B$$

Next, each band signal is passed into a respective compression function, CF 104($a$), 104($b$), ... 104(B), along with respective time-varying thresholds $T_b[n]$. FIG. 1B provides exemplary input/output characteristics of CF 104($a$), 104($b$), ... 104(B) as a function of $T_b[n]$. The input level for the compression function can be computed as a function of the band signal $x_b[n]$ in a number of ways. For example, a fast-attack/slow-release one-pole smoother (e.g., energy estimator 108) can be applied to the square of the signal $x_b[n]$ to compute an estimate of the time-varying energy $e_b[n]$ in each band:

$$e_b[n] = \begin{cases} \lambda_A e_b[n-1] + (1-\lambda_A)x_b^2[n], & x_b^2[n] \geq e_b[n-1] \\ \lambda_R e_b[n-1] + (1-\lambda_R)x_b^2[n], & \text{otherwise} \end{cases}$$

An attack time value ($\lambda_A$) can be on an order of 10 ms, while a release time value ($\lambda_R$) can be on an order of 100 ms (e.g., 10 times greater release time over attack time, or more). As a level of the input signal $x_b[n]$, as estimated by $e_b[n]$, approaches a threshold $T_b[n]$, an output signal rises more slowly and is eventually limited to such threshold (as reflected by changes in output gain $g_b[n]$).

Figure 1C:
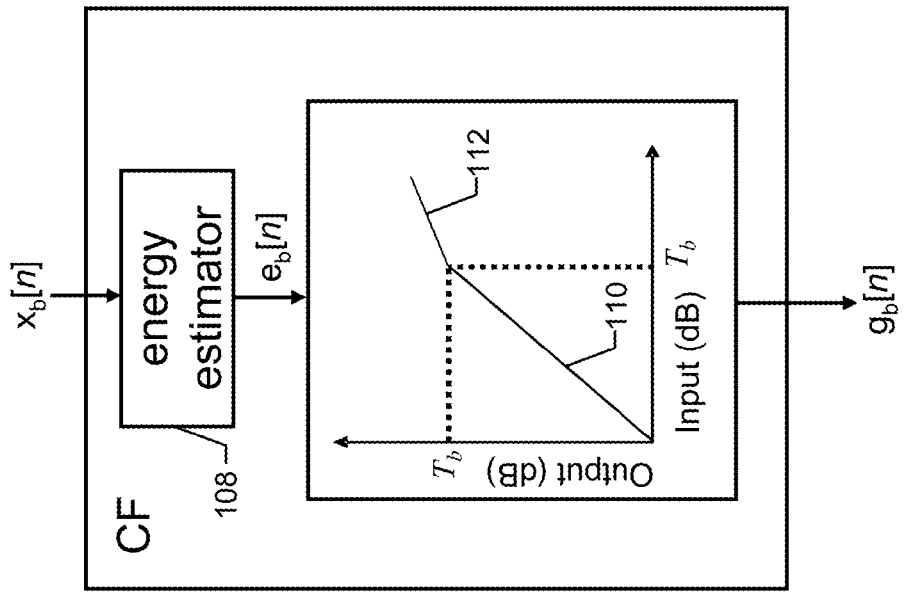
FIGS. 1B and 1C provide exemplary input/output characteristics of compression functions according to embodiments of the present invention.
Figure 1B:
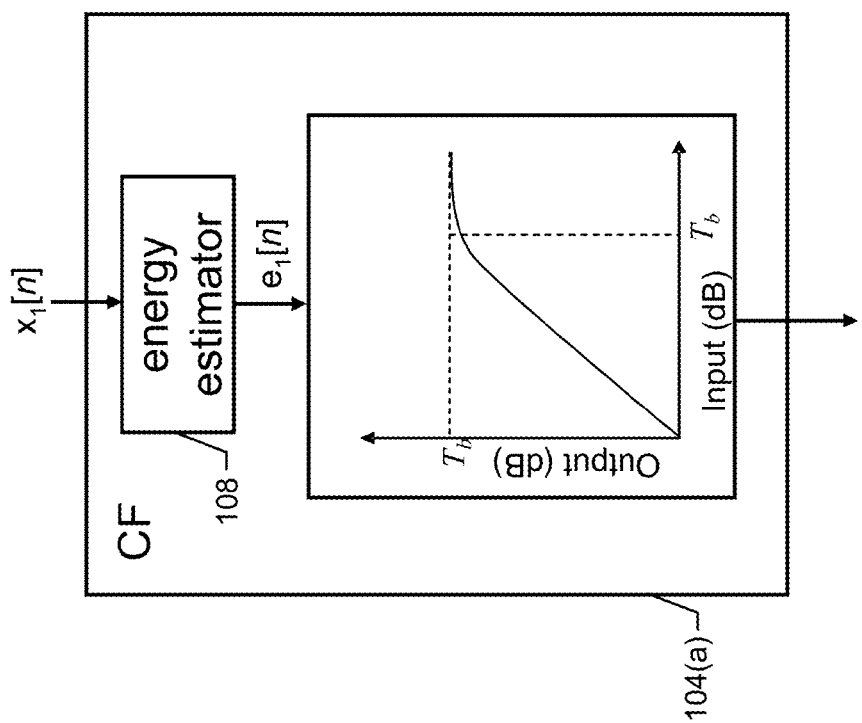

FIG. 1C illustrates another compression function. In this case, an input/output slope 110, below threshold $T_b[n]$, exceeds slope 112, above threshold $T_b[n]$. In lieu of an asymptotic time-varying threshold, it can be desirable to continue attenuation at a differing rate (e.g., reduced rate or greater rate) beyond the time-varying threshold. In a specific embodiment, slope 110 is equal to 1 or less, while slope 112 is less than slope 110 or even zero. It should be further appreciated that CF 104($a$), 104($b$), ... 104(B) can each have differing or individualized input/output characteristics for the particular frequency band.

These time-varying thresholds $T_b[n]$ are computed using a timbre preserving function (TPF) element 106. In this embodiment, each time-varying threshold $T_b[n]$ is computed as a function of all band signals $x_b[n]$ and all fixed thresholds $L_b$ across bands b=1 ... B:

$$T_b[n]=TPF(\{x_i[n], L_i\}_{i=1 \ldots B})$$

The gains, $g_b[n]$, for each band are then computed as $g_b[n]=CF(x_b[n], T_b[n])$.

As an alternative, each threshold $T_b[n]$ can be computed as a function of a plurality, but less than all, of band signals $x_b[n]$ and/or a plurality, but less than all, of fixed thresholds $L_b$. A time-varying threshold for a frequency band can be computed based on its nearest neighbor bands or a range of neighboring bands. In some cases it may be desirable to allow particular bands to operate in complete isolation, with no contribution, to TPF. For example, some audio systems can have extremely low fixed thresholds in bass frequencies due to a small speaker size. If these bass frequency bands were allowed to contribute to the TPF, a drastic reduction of the overall playback level can result. In such a case, it can desirable to allow these bass frequency bands operate independently, and apply the TPF to the remaining frequency bands. Alternatively, an additional frequency dependent weighting could be employed to weigh these bass frequency bands less heavily.

In compressor 100, TPF element 106 decreases time-varying thresholds of frequency bands with input levels falling below their fixed thresholds $L_b$ as a function of other frequency bands exceeding their fixed thresholds $L_b$. In other words, if a frequency band receives significant gain reduction due to being above its fixed threshold, then the time-varying thresholds of other frequency bands are also decreased to receive some gain reduction. Since the time-varying threshold for the frequency band is decreased below its respective fixed threshold, compressor 100 still reduces distortion while alteration to the timbre is mitigated or otherwise prevented.

As an embodiment of the present invention, TPF element 106 can be configured to compute an average difference of the audio input signal in each frequency band and its respective fixed threshold, $L_b$. The time-varying threshold in each frequency band can then be the audio input signal level in such band minus this average difference.

Additionally, time-varying thresholds can be smoothed over time, at least more so than gains $g_b[n]$. That is to say, the levels of audio input signal used for computing thresholds can be smoothed more heavily than the signals (e.g., $e_b[n]$) used for computing the gains $g_b[n]$. A one pole smoother with longer time constants can be employed to compute a smoother energy signal $s_b[n]$:

$$s_b[n] = \begin{cases} \alpha_A s_b[n-1] + (1-\alpha_A)x_b^2[n], & x_b^2[n] \geq s_b[n-1] \\ \alpha_R s_b[n-1] + (1-\alpha_R)x_b^2[n], & \text{otherwise} \end{cases}$$

In this case, attack and release times on the order of 10 times more than a conventional multi-band compressor can be used. The smooth energy signal is then represented in dB:

$$S_b[n] = 10\log_{10}(s_b[n])$$

The difference between the smooth energy signal in each band and the fixed threshold $L_b$ in each band, also represented in dB, is computed as:

$$D_b[n] = S_b[n] - L_b$$

and the minimum of these distances over all bands is found:

$$D_{min}[n] = \min_b \{D_b[n]\}$$

A weighted average of these differences across bands is then computed, where $\beta$ represents the weighting factor:

$$D_{avg}[n] = \left(\frac{\sum_{b=1}^{B}(D_b[n] - D_{min}[n])^\beta}{B}\right)^{\frac{1}{\beta}} + D_{min}[n]$$

When $\beta=1$, the true average of the differences is computed, and when $\beta>1$ the larger differences contribute more heavily to the average. In other words, frequency bands having energy farther above threshold $L_b$ contribute more. In practice, $\beta=8$ yields an adequate weighting for the TPF element 106. Finally, the threshold $T_b[n]$ is computed as the smooth signal energy in a frequency band minus an average difference when this threshold is less than the fixed threshold $L_b$. Otherwise, the time-varying threshold is kept equal to the fixed threshold:

$$T_b[n] = \begin{cases} S_b[n] - D_{avg}[n], & S_b[n] - D_{avg}[n] < L_b \\ L_b & \text{otherwise} \end{cases}$$

As an alternate implementation of a TPF element, rather than a weighted average, a threshold from a maximum of the distances $D_b[n]$ can be computed:

$$D_{max}[n] = \max_b \{D_b[n]\}$$

Each threshold can then be computed as the smooth signal energy in the frequency band minus the maximum distance plus some tolerance value $D_{tol}$, if this threshold is less than the fixed threshold:

$$T_b[n] = \begin{cases} S_b[n] - D_{max}[n] + D_{tol}, & S_b[n] - D_{max}[n] + D_{tol} < L_b \\ L_b & \text{otherwise} \end{cases}$$

The tolerance value $D_{tol}$ can be designed to allow some variation in the amount of compression applied to each frequency band. For a specific embodiment, a practical value of $D_{tol}=12$ dB allows sufficient variation.

Figure 2:
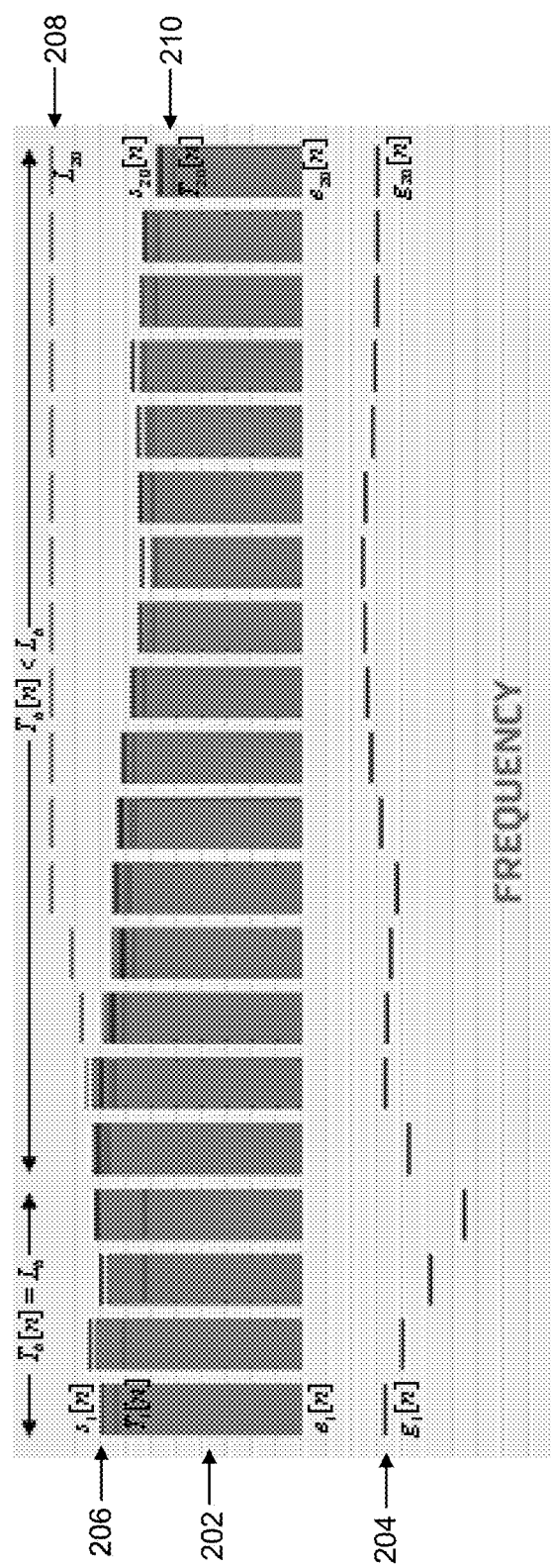
FIG. 2 is a simplified diagram illustrating exemplary results according to an embodiment of the present invention.

FIG. 2 shows exemplary results of applying TPF to a 20-band compressor on a real-world audio signal. In this case, twenty frequency bands were selected and spaced to mimic perceptual resolution of human hearing, and fixed thresholds for each frequency band were determined by listening tests to prevent distortion on playback device speakers. The resulting band signal energies $e_b[n]$ feeding the compressor function are represented by bars 202. The resulting gains $g_b[n]$ are depicted by lines 204. The middle of FIG. 2 represents 0 dB and the bottom represents −30 dB. The smooth signal energies $s_b[n]$ are depicted by lines 206. The fixed thresholds $L_b$ and time-varying thresholds $T_b[n]$ are depicted by lines 208 and 210, respectively.

In this example, the smooth signal energies $e_b[n]$ and $s_b[n]$ are well above the fixed thresholds $L_b$ for frequency bands 1 through 4, and therefore those frequency bands receive significant attenuation. Frequency bands 1 through 4 do not need time-varying thresholds lowered, and $T_b[n]=L_b$. On the other hand, for bands 5-20, the signal energies $e_b[n]$ and $s_b[n]$ are either not far above or completely below their fixed thresholds $L_b$. As a result, thresholds are lowered, $T_b[n]<L_b$, in some cases significantly, as a function of bands 1 through 4 showing significant attenuation. The end result is that all 20 frequency bands receive attenuation. Without a timbre preservation constraint according to embodiments of the present invention, frequency bands 6 through 20 would receive no attenuation at all since $e_b[n]<L_b$, leading to significant alteration to timbre. For example, there would be a 20 dB differential between bands 4 and 9, but with TPF the difference is reduced to 8 dB.

Figure 3:
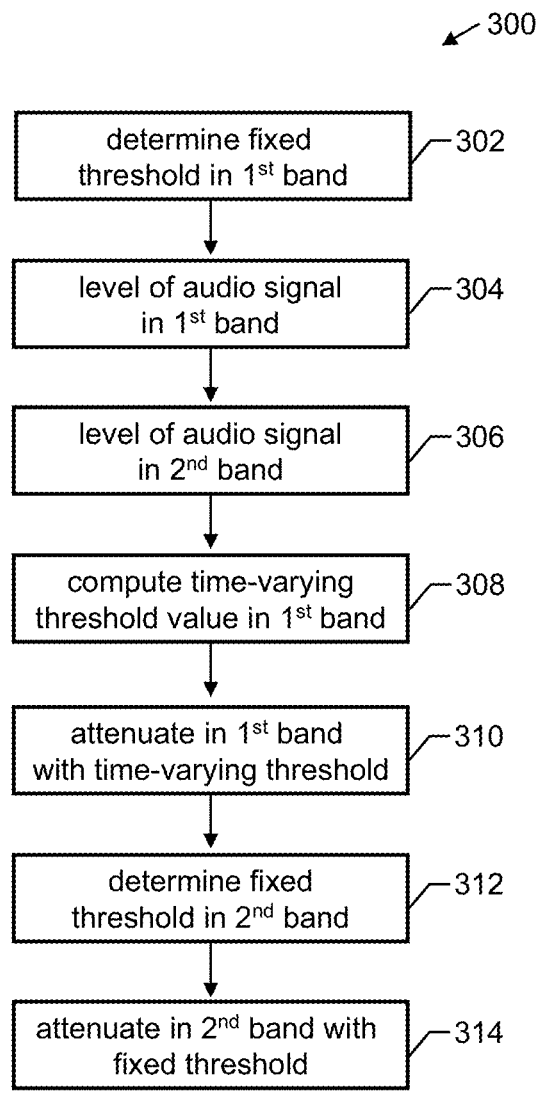
FIG. 3 illustrates a simplified flow diagram according to an embodiment of the present invention.

FIG. 3 illustrates a simplified flow diagram 300 according to an embodiment of the present invention. In step 302, a fixed threshold for a first frequency band is determined or provided. Next, a first level of an audio signal is determined within the first frequency band in step 304. The first level can be less than the fixed threshold. For step 306, a second level of the audio signal is determined for a second frequency band. The second frequency band differs from the first frequency band. A time-varying threshold for the first frequency band is computed, or otherwise determined, using the second level and a fixed threshold in the second frequency band in step 308. The time-varying threshold is less than or equal to the fixed threshold of the first frequency band. Finally, in step 310, the audio signal is attenuated within the first frequency band to be less than or equal to the time-varying threshold. It should be appreciated that attenuation of a signal can occur before a threshold (whether fixed or time-varying) is reached as illustrated in FIG. 1B, where gradual attenuation is applied as the time-varying threshold is approached.

Optionally, in steps 312 and 314, a second fixed threshold for the second frequency band is determined The second level of the audio signal can exceed the second fixed threshold. The audio signal is attenuated within the second frequency band to the second fixed threshold. In addition to steps 312 and 314, other alternatives can also be provided where steps are added, one or more steps are removed, or one or more steps are provided in a different sequence from above without departing from the scope of the claims herein. These above steps can be performed by one or more devices that include a processor.

Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques. The techniques are not limited to any specific combination of hardware circuitry and software, nor to any particular source for the instructions executed by a computing device or data processing system.

The term "storage media" as used herein refers to any media that store data and/or instructions that cause a machine to operation in a specific fashion. It is non-transitory. Such storage media may comprise non-volatile media and/or volatile media. Non-volatile media includes, for example, optical or magnetic disks. Volatile media includes dynamic memory. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics. Transmission media can also take the form of acoustic or light waves, such as those generated during radio-wave and infra-red data communications.

The term "audio transducers" as used herein can include, without limitation, loudspeakers (e.g., a direct radiating electro-dynamic driver mounted in an enclosure), horn loudspeakers, piezoelectric speakers, magnetostrictive speakers, electrostatic loudspeakers, ribbon and planar magnetic loudspeakers, bending wave loudspeakers, flat panel loudspeakers, distributed mode loudspeakers, Heil air motion transducers, plasma arc speakers, digital speakers and any combination/mix thereof.

Equivalents, Extensions, Alternatives, and Miscellaneous

In the foregoing specification, possible embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense. It should be further understood, for clarity, that exempli gratia (e.g.) means "for the sake of example" (not exhaustive), which differs from id est (i.e.) or "that is."

Additionally, in the foregoing description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

What is claimed is:

1. An apparatus comprising:
    a multi-band filterbank configured to split an audio signal for a plurality of frequency bands;
    compression function element dedicated to a frequency band of the plurality of frequency bands;
    a timbre preservation element coupled to the compression function element, the timbre preservation element configured to provide a time-varying threshold for the frequency band; and
    at least one audio transducer configured to audibly present an audio signal outputted from the compression function element,
    wherein the time-varying threshold for the frequency band is determined by levels of the audio signal from neighboring frequency bands but not all of the plurality of frequency bands.

2. The apparatus of claim 1 wherein the time-varying threshold for the frequency band is further determined by a plurality of fixed thresholds from the neighboring frequency bands.

3. The apparatus of claim 1 wherein the levels are estimated power levels.

4. An apparatus comprising:
    a multi-band filterbank configured to split an audio signal for a plurality of frequency bands;
    compression function element dedicated to a frequency band of the plurality of frequency bands;
    a timbre preservation element coupled to the compression function element, the timbre preservation element configured to provide a time-varying threshold for the frequency band; and
    at least one audio transducer configured to audibly present an audio signal outputted from the compression function element,
    wherein the time-varying threshold for the frequency band is determined by at least one level of the audio signal outside the frequency band but not all of the plurality of frequency bands.

5. The apparatus of claim 4 wherein the time-varying threshold for a first frequency band is further determined by a fixed threshold from a neighboring band.

6. The apparatus of claim 4 wherein the at least one level is estimated power levels.

* * * * *